(12) United States Patent
Chang et al.

(10) Patent No.: US 7,317,221 B2
(45) Date of Patent: Jan. 8, 2008

(54) HIGH DENSITY MIM CAPACITOR STRUCTURE AND FABRICATION PROCESS

(75) Inventors: Kuan-Lun Chang, Hsinchu (TW); Chuan-Ying Lee, Hsin Chu (TW); Chun-Hon Chen, Jubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 121 days.

(21) Appl. No.: 10/729,034

(22) Filed: Dec. 4, 2003

(65) Prior Publication Data

US 2005/0121744 A1    Jun. 9, 2005

(51) Int. Cl.
*H01L 29/72* (2006.01)

(52) U.S. Cl. ............... 257/306; 257/307; 257/296; 257/516; 257/532; 438/239; 438/253; 438/396; 438/957

(58) Field of Classification Search ........... 438/238, 438/239, 253, 396, FOR. 220, FOR. 430, 438/957; 257/306, E27.088, 296, 307, 516, 257/532
See application file for complete search history.

(56) References Cited

U.S. PATENT DOCUMENTS

| 6,710,425 | B2 * | 3/2004 | Bothra | 257/532 |
| 6,777,777 | B1 * | 8/2004 | Kar-Roy et al. | 257/532 |
| 2002/0056869 | A1 * | 5/2002 | Morimoto | 257/313 |
| 2002/0192919 | A1 * | 12/2002 | Bothra | 438/381 |
| 2004/0152258 | A1 * | 8/2004 | Kiyotoshi | 438/253 |
| 2005/0006771 | A1 * | 1/2005 | Akiyama | 257/758 |

\* cited by examiner

*Primary Examiner*—Matthew Smith
*Assistant Examiner*—Joannie Adelle Garcia
(74) *Attorney, Agent, or Firm*—Tung & Associates

(57) ABSTRACT

A stacked integrated circuit (IC) MIM capacitor structure and method for forming the same the MIM capacitor structure including a first MIM capacitor structure formed in a first IMD layer comprising an first upper and first lower electrode portions; at least a second MIM capacitor structure arranged in stacked relationship in an overlying IMD layer comprising a second upper electrode and second lower electrode to form an MIM capacitor stack; wherein, the first lower electrode is arranged in common electrical signal communication comprising metal filled vias with the second upper electrode and the first upper electrode is arranged in common electrical signal communication with the second lower electrode.

19 Claims, 4 Drawing Sheets

HIGH DENSITY MIM CAPACITOR STRUCTURE AND FABRICATION PROCESS

FIELD OF THE INVENTION

This invention generally relates to passive metal-insulator-metal (MIM) capacitor structures and more particularly to an MIM stacked capacitor structure and method for forming a stacked MIM capacitor structure to achieve higher density capacitance values while minimizing component area usage.

BACKGROUND OF THE INVENTION

Advances in technology have resulted in an increasing demand for system-on-chip products where both analog and digital signal processing are desirable. For example analog circuits capture an analog signal from the surrounding environment and transform the signal into bits which are then transformed into signals for driving digital circuitry and output functions. Increasingly it is advantageous to have both the analog circuitry and digital circuitry in close proximity, for example in the form digital blocks and analog blocks of circuitry which function together to implement the function of the system, also referred to as mixed mode systems.

For example, passive components (inductors, resistors, and capacitors) in analog/mixed-signal design passives are used for a wide variety of functions including tuning, filtering, impedance matching, and gain control. For example MIM capacitors are critical in several mixed signal integrated circuits such as analog frequency tuning circuits, switched capacitor circuits, filters, resonators, up-conversion and down-conversion mixers, and A/D converters.

In metal-insulator-metal (MIM) structures, which are included in analog circuitry building blocks, smaller capacitors are desirable from the standpoint of lower power consumption and increased feature density in a semiconductor device (chip).

Many analog and mixed mode systems rely on precise reproducibility in the electronic properties of circuit component structures, such as MIM structures, to achieve the electrical matching of the various circuitry components. Electronic mismatch of circuitry components results in reduced signal processing quality and is adversely affected by deviations in critical dimensions between components which is exacerbated by the increased number of processing steps generally required for producing the same component having different passive values, for example capacitance.

One continuing problem with the integration of analog and digital circuitry blocks is the increase in power consumption. The design constraints that inform the design of digital blocks include the need for fast signal transmission and low power consumption. On the other hand in analog circuitry, the design constraints are strongly informed by the actual electrical performance of the passive components, for example the capacitance value of capacitors. For example, an integrated circuit requiring a number of MIM capacitors, each MIM capacitor occupies a given area projected through the volume of a chip. In particular, the presence of components underlying or overlying an MIM capacitor is not desirable due to parasitic influences on the capacitance value of the MIM. As a result, passive components generally occupy a large amount of space in CMOS analog integrated circuitry, leading to higher processing costs. For example, assuming the capacitor dielectric and thickness remains the same, about twice the area of capacitor dielectric is need to double the capacitance value.

There is therefore a continuing need in the semiconductor device processing art for improved MIM capacitor structures and manufacturing processes to achieve lower cost production and higher feature density while maintaining capacitance value precision.

It is therefore an object of the invention to provide an improved MIM capacitor structure and manufacturing processes to achieve lower cost production and higher feature density while maintaining capacitance value precision, while overcoming other deficiencies and shortcomings of the prior art.

SUMMARY OF THE INVENTION

To achieve the foregoing and other objects, and in accordance with the purposes of the present invention, as embodied and broadly described herein, the present invention provides a stacked integrated circuit (IC) MIM capacitor structure and method for forming the same.

In a first embodiment, the MIM capacitor structure includes a first MIM capacitor structure formed in a first IMD layer comprising an first upper and first lower electrode portions; at least a second MIM capacitor structure arranged in stacked relationship in an overlying IMD layer comprising a second upper electrode and second lower electrode to form an MIM capacitor stack; wherein, the first lower electrode is arranged in common electrical signal communication comprising metal filled vias with the second upper electrode and the first upper electrode is arranged in common electrical signal communication with the second lower electrode.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

The stacked MIM capacitor structure and method for forming the same according to the present invention is more clearly described by referring to FIGS. 1A-1E where cross sectional views at stages of manufacture are shown in forming the stacked MIM capacitor structure.

Figure 1A:
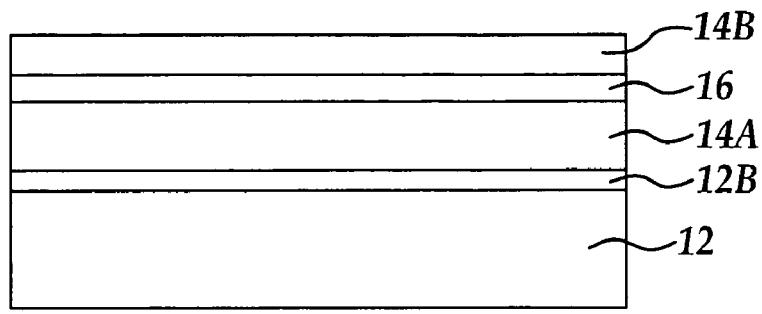
FIGS. 1A-1E are cross-sectional views of a portion of an exemplary stacked MIM semiconductor structure at processing stages according to an embodiment of the present invention.

FIGS. 1A-1E show an embodiment of the present invention in forming an exemplary stacked MIM structure. For example, referring to FIG. 1A is shown a first IMD layer 12, for example a third level (IMD3) layer. It will be appreciated that there are underlying IMD layers formed over a semiconductor process wafer, for example silicon, the semiconductor wafer including active areas with CMOS transistors. Preferably, however, no active areas, components or devices are located directly underlying the stacked MIM structure shown in the Figures in order to reduce the influence of parasitic electrical effects on the electrical behavior of the stacked MIM structure.

Still referring to FIG. 1A, the first IMD layer 12 and lower and upper IMD layers may be formed of conventional dielectric insulating layers including silicon oxide based doped or undoped materials, including Low-K silicon oxide based materials such as carbon doped silicon oxide, but is more preferably undoped silicate glass (USG) for enhanced structural stability or fluorinated silicate glass (FSG) for structural stability together with lower dielectric constant deposited by conventional methods including LPCVD, PECVD, or HDP-CVD.

Still referring to FIG. 1A, a first lower conductive electrode 14A is formed over layer 12 by depositing one or more layers of conductive material by conventional processes, for example AlCu, Ta, TaN, Ti, TiN, W, and WN. Preferably the electrode 14A includes a lowermost layer of metal and an uppermost layer of a metal nitride such as TaN, TiN, WN and/or silicided metal nitride such as TaSiN, TiSiN, and WSiN. For example, a first metal layer of Ta or AlCu is deposited by a sputter deposition method, preferably ion metal plasma (IMP), followed by sputter deposition of a TaN layer followed by silicidation of the TaN layer with silane ($SiH_4$) or dichlorosilane ($SiH_2Cl_2$). The overall thickness of the bottom electrode layer 14A is between about 1000 Angstroms to about 4000 Angstroms, depending on the IC application of the MIM capacitor.

Still referring to FIG. 1A, a layer of capacitor dielectric 16 is then deposited over the electrode 14A by conventional means including LPCVD, PECVD, and ALCVD. The material may include any capacitor dielectric such as $SiO_2$, metal nitrides, such as silicon nitride (e.g., $Si_3N_4$) or high dielectric constant materials such as $TiO_2$, $Ta_2O_5$, $ZrO_2$, including rare earth oxides such as $Y_2O_3$, $La_2O_5$, $HfO_2$, and their aluminates and silicates. A higher dielectric constant material such as $Ta_2O_5$ is preferred for the stacked capacitor structures due to its compatibility with preferred electrode material such as AlCu, Ta, and TaN together with reduced influence of parasitic capacitances on a desired capacitance value. It will be appreciated that the thickness of the capacitor dielectric layer 16 will vary depending on the dielectric material and the desired capacitance.

Still referring to FIG. 1A, an upper metal electrode layer 14B is then deposited over the capacitor dielectric layer 16, again by conventional sputter deposition techniques, preferably ion metal plasma (IMP). The upper metal electrode layer 14B preferably includes at least one conductive layer, for example including the same preferred materials deposited in the reverse order as the lower (bottom) electrode layer 14A. For example, the upper electrode layer 14B is formed of Ta or AlCu, more preferably AlCu with a lowermost layer of metal nitride such as TiN or TaN, more preferably TaN, to act as a diffusion barrier. For example, the lowermost metal nitride layer of upper electrode layer 14B may range from about 75 Angstroms to about 300 Angstroms. The overall thickness of the upper electrode layer 14B is preferably about the same thickness or preferably thinner than the lower electrode layer 14A thickness, depending on the application. For example the upper electrode layer thickness 14B may be up to about half as thick as the bottom electrode layer thickness, e.g., from about 500 Angstroms to about 3000 Angstroms to reduce a series resistance in high frequency applications. Following deposition of the upper electrode metal layer 14B, a dielectric anti-reflectance coating (ARC) layer such as silicon oxynitride (e.g., SiON) (not shown) may optionally be deposited to improve a subsequent photolithographic patterning process to define an upper electrode etching pattern.

Figure 1B:
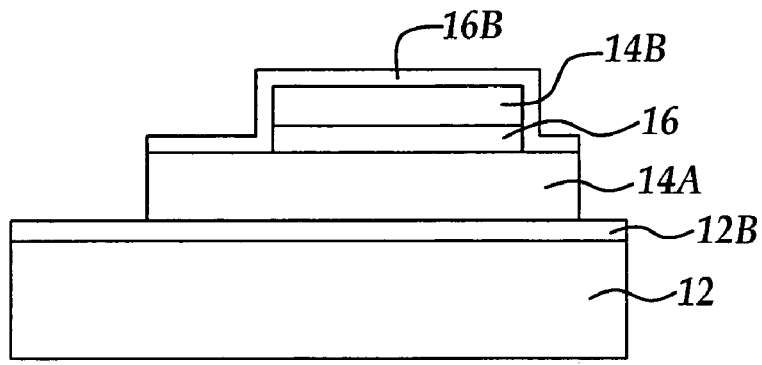

Referring to FIG. 1B, conventional photolithographic patterning and etching processes are carried out to define upper and lower electrode portions including the capacitor dielectric layer for the first MIM capacitor structure. For example, a patterning process followed by an RIE etching process is carried out to first etch through portions of the upper electrode layer 14B and the capacitor dielectric layer 16 to stop on the uppermost layer of the bottom electrode, e.g., a TaN layer to define the upper electrode portion 14B and the dielectric capacitor portion 16 having a smaller width than the subsequently formed bottom electrode portion. Preferably, a nitride capping layer 16B, functioning as a subsequent etch stop layer and as an electrode passivation layer is then deposited by conventional means, for example PECVD or HDP-CVD to a thickness of about 100 Angstroms to about 500 Angstroms. Preferably the nitride capping layer 16B is formed of silicon oxynitride (e.g., SiON) or silicon nitride (e.g., SiN), more preferably SiON. Following deposition of the capping layer 16B, a second photolithographic patterning and RIE etching process is carried out to etch through portions of the lower electrode layer 14A thickness to stop on the etch stop layer 12 to define the lower electrode portion 14A.

Figure 1C:
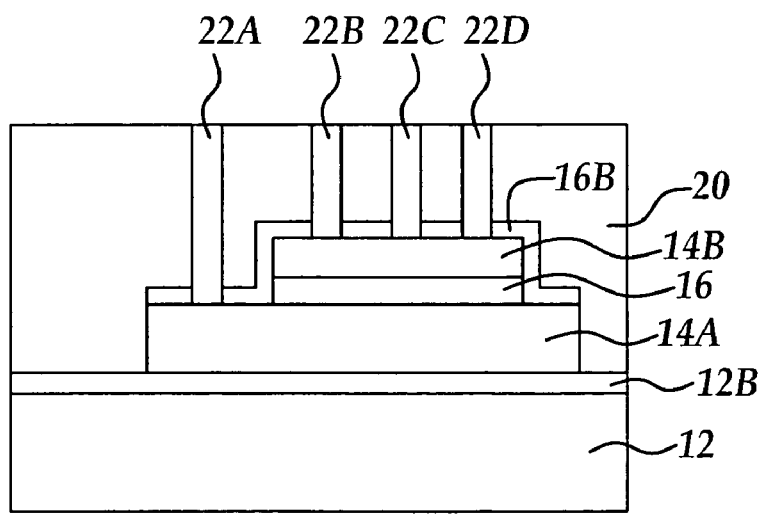

Referring to FIG. 1C, dielectric insulating layer 20 e.g., IMD4 layer is then deposited in a similar manner using similar preferred materials as outlined above with respect to IMD3 layer 12, preferably USG or FSG, followed by planarization of the upper portion of IMD4 layer by a CMP process. Optionally an ARC layer (not shown), for example SiON may be deposited to improve a subsequent via patterning process. Conventional processes are then followed to form damascene metal filled plugs, also referred to as vias, preferably having a linewidth of less than about 0.25 microns, including about 0.13 microns. For example, conventional photolithographic patterning, RIE etching, metal filling, and planarization steps are sequentially carried out to form the damascene plugs e.g., 22A, 22B, 22C, and 22D, to form electrical communication with both the first lower electrode 14A, e.g., via 22A and the first upper electrode 14B, e.g., vias 22B, 22C, and 22D. The vias may be filled with copper (Cu), aluminum (Al), AlCu, or tungsten (W) by conventional processes and in one embodiment are preferably formed of W plugs by a conventional tungsten plug formation process. Deposition of barrier layers by conventional processes and materials, e.g., TiN, TaN, Ti/TaN, Ta/TaN including silicided metal nitride layers may be deposited to line the via openings prior to the metal filling process.

Figure 1D:
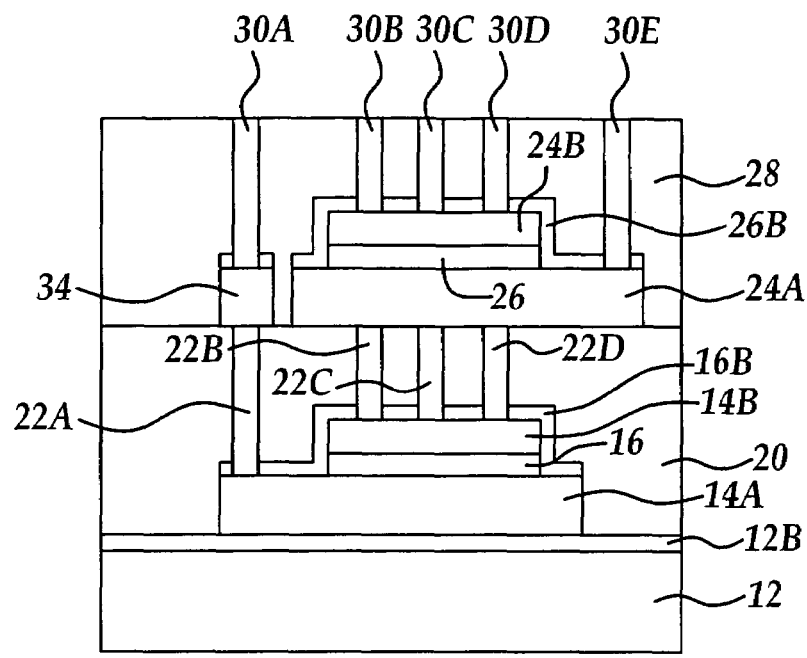

Referring to FIG. 1D, following planarization of IMD4 layer 20 to expose the IMD4 upper surface, a similar series of process steps are then carried out to form a second lower electrode portion 24A, second dielectric capacitor portion 26 second capping layer portion 26B, second upper electrode portion 24B, IMD5 layer 28 and metal filled vias 30A, 30B, 30C, 30D, and 30E. In etching to form the second lower electrode 24A, a portion of the second lower electrode layer is patterned and etched to form a via interconnect stud 34 for electrically connecting via 30A in IMD5 layer 28 with via 22A in IMD 4 layer 20 to form electrical communication with first lower electrode portion 14A. Via 30E is formed in electrical communication with second lower electrode 24A and first upper electrode 14B along vias 22B, 22C and 22D.

Figure 1E:
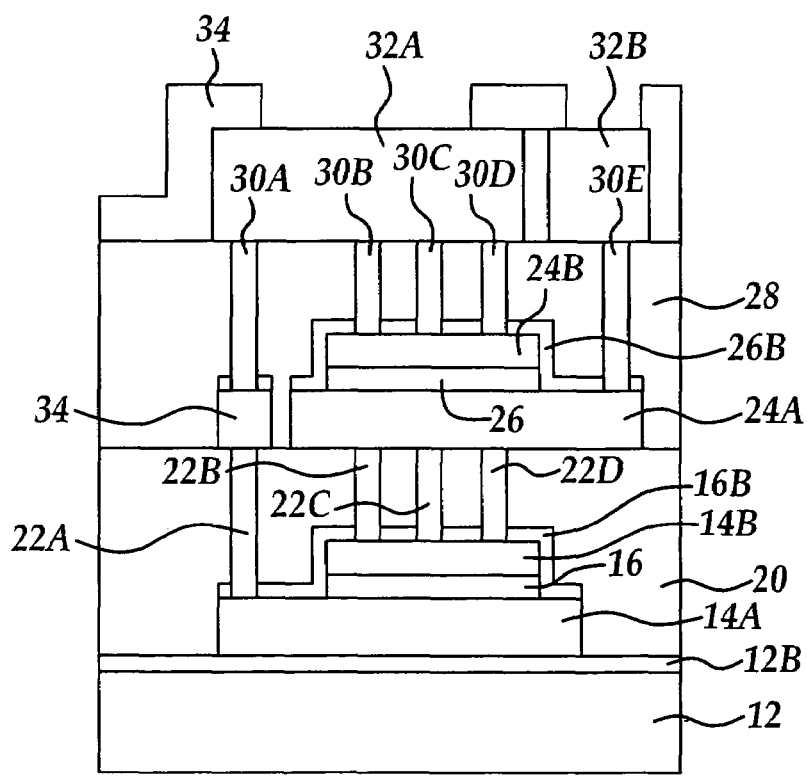

Referring to FIG. 1E, following via plug formation and planarization of IMD5 layer 28, a top metallization layer e.g., is sputter deposited, patterned and etched in a manner similar to forming the electrode portions 14A and 24A to form bonding pads 32A and 32B. Preferably an AlCu alloy is used to form the bonding pads 32A and 32B, for example including an upper Al layer to enhance wire bonding operations. Following forming bonding pads 32A and 32B, for example having a thickness greater than about 10,000 Angstroms, one or more passivation layers e.g., 34 are blanket deposited over the process surface including the bonding pad followed by another patterning and etching process to etch through the one or more passivation layers to expose a portion of the bonding pad surfaces 32A and 32B. For example, the one or more passivation layers e.g., 34 preferably includes at least one lowermost layer of $SiO_2$, followed by an overlying layer of SiN or SiON. For example, a series of oxide nitride or oxide-nitride-oxide (ONO) layers are deposited by conventional PECVD or HDP-CVD process followed by photolithographically patterning and RIE etching to expose the surface of bonding pads 32A and 32B. The bonding pad 32A forms electrical signal communication with the second upper electrode 24B and the first lower electrode 14A while the bonding pad 32B forms electrical signal communication with the second lower electrode 24A and the first upper electrode 14B.

Figure 2A:
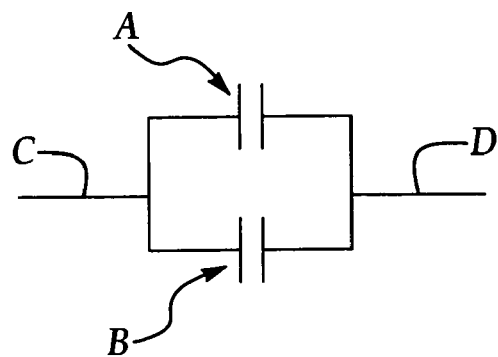
FIGS. 2A-2D are schematic circuit diagrams of exemplary embodiments of the present invention.

Referring to FIG. 2A is shown an equivalent circuit of the two stacked MIM capacitor structures shown in FIG. 1E e.g., creating capacitors in parallel e.g., A and B where electrical signal wiring connections e.g., C and D represent the electrical signal pathway e.g., through bonding pads 32A and 32B.

Figure 2B:
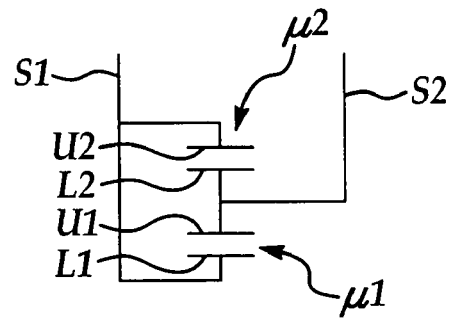
Figure 2C:
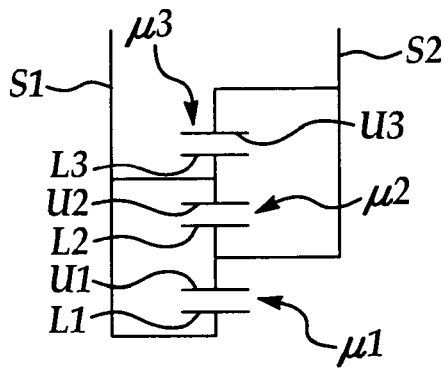
Figure 2D:
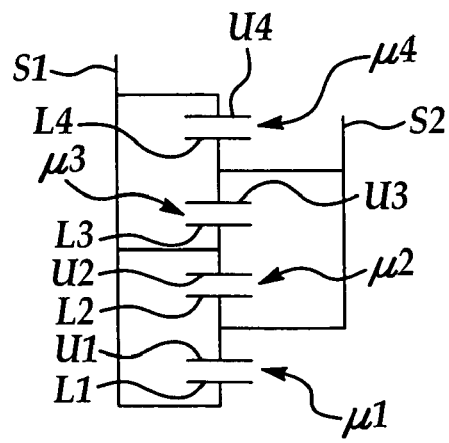

Referring to FIG. 2B, is shown another equivalent circuit representation of the electrical wiring (interconnect) pathway where two stacked MIM structures M1 and M2 are formed in stacked relationship as shown in FIG. 1E with lower electrode L1 (e.g., 14A) of M1 and upper electrode U2 (e.g., 24B) of M2 are supplied by Signal S1 and upper electrode U1 (e.g., 14B) and U2 (e.g., 24A), respectively, of M1 and M2 are supplied by signal S2. Referring to FIGS. 2C and 2D, it will be appreciated that more than two MIM structures may be stacked as shown. For example referring to FIG. 2C, M1, M2, and M3 with respective lower electrodes L1, L2, L3 and U1, U2, U3 are stacked whereby the odd numbered M1 and M3 structures share a common electrical connection to their respective upper and lower electrodes e.g., U1, U3 supplied by common signal S2, and L1, L3 supplied by common signal S1. Referring to FIG. 2D, four MIM structures M1, M2, M3, and M4 are stacked such that the even numbered upper electrodes e.g., U2, U4 are supplied by a common signal S1 and the even numbered lower electrodes L2, L4 are supplied by a common signal S2. It will be appreciated that the MIM capacitor structures are preferably formed such that the uppermost MIM structure communicates with bonding pads in the uppermost metallization layer to provide signals S1 and S2. It is additionally preferred that the lowermost MIM capacitor structure be formed in at least a second, more preferably at least a third IMD layer above the semiconductor wafer to reduce capacitive coupling with the active portions of the device.

Thus, an improved MIM structure and method for forming stacked MIM capacitor structures has been presented having an improved process flow. Advantageously, the same mask is used for patterning the upper electrode portions, for example, both the first upper electrode e.g., 14B and the second upper electrode 24B, thereby reducing cost and increasing yield. In addition, by using commonly connected electrodes, e.g., second bottom electrode 24A and first upper electrode 14B, in the stacked MIM structure according to an embodiment of the invention, the equivalent series capacitance may be increased, for example doubled, while reducing device area and volume and minimizing the number of wiring interconnects. In addition, overall processing time is reduced thereby reducing manufacturing cost.

Figure 3:
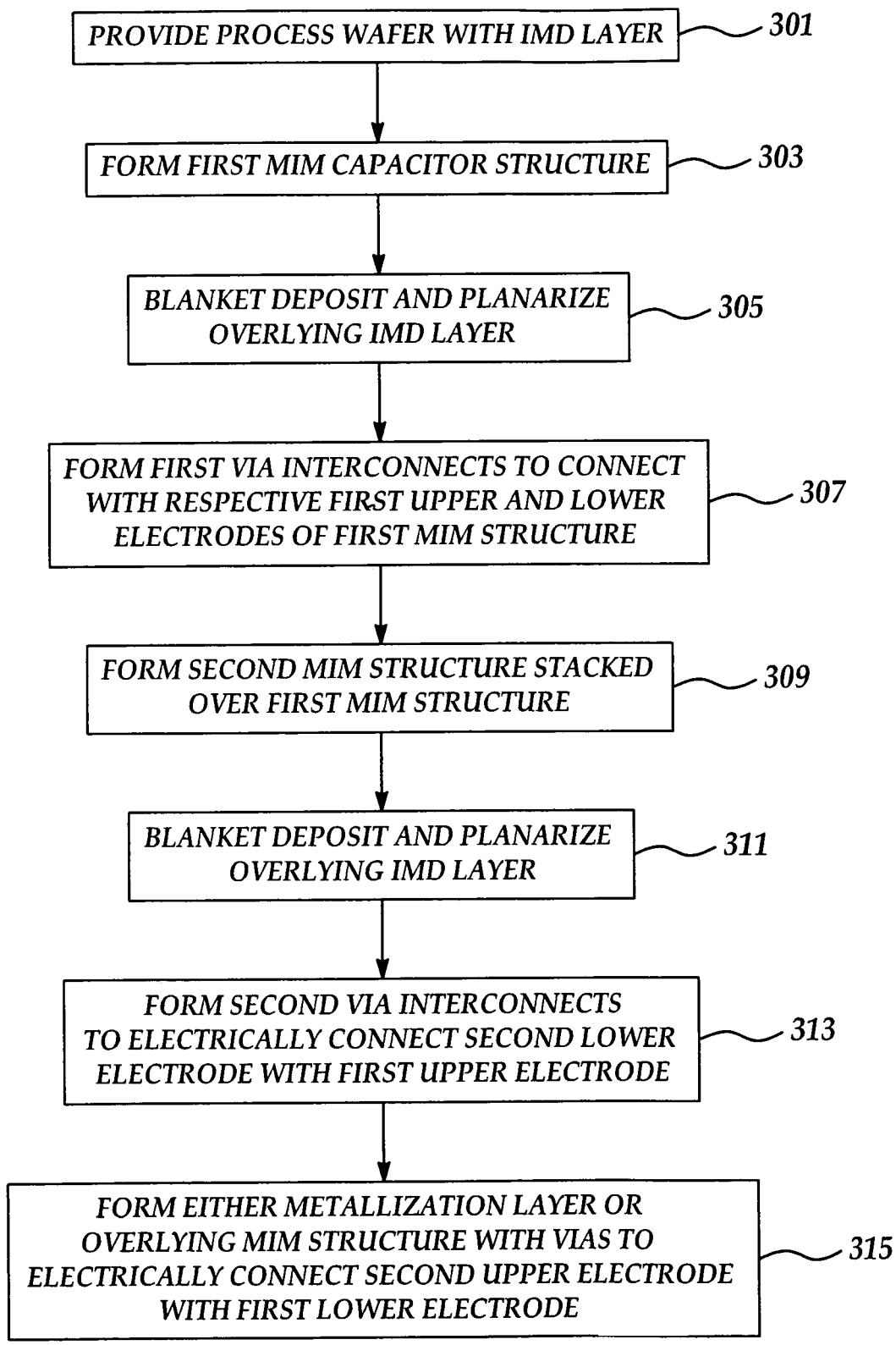
FIG. 3 is a process flow diagram including several embodiments of the present invention.

Referring to FIG. 3 is a process flow diagram including several embodiments of the present invention. In process 301, a semiconductor process wafer including at least one IMD layer is provided. In process 303 a first MIM structure (capacitor) is formed comprising upper and lower electrodes sandwiching a capacitor dielectric. In process 305, a first IMD layer is blanket deposited over the first MIM structure and planarized. In process 307, respective upper electrode vias and lower electrode vias are formed in electrical communication with the respective electrodes. In process 309 a second MIM structure is formed overlying and in stacked relationship with the first MIM structure. In process 311, an overlying IMD layer is blanket deposited over the first MIM structure and planarized. In process 313, second upper electrode via interconnects are formed where the second lower electrode is formed in electrical communication with the first upper electrode. In process 315, either an overlying metallization layer or an overlying stacked MIM structure is formed such that the second upper electrode is formed in electrical communication with the first lower electrode to form stacked MIM structures in equivalent parallel capacitance relationship.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A stacked integrated circuit (IC) MIM capacitor structure comprising:
    a first MIM capacitor structure disposed in a first IMD layer comprising a first upper electrode and a first lower electrode; and,
    at least a second MIM capacitor structure arranged in stacked relationship in an overlying IMD layer comprising a second upper electrode and second lower electrode separate from said first upper and first lower electrodes to form an MIM capacitor stack;
    wherein, the first lower electrode is arranged in common electrical signal communication comprising electrically communicating vias with the second upper electrode and the first upper electrode is arranged in common electrical signal communication with the second lower electrode to form said MIM capacitor stack in parallel electrical relationship; wherein the lower electrodes including electrically communicating vias of the respective MIM structures in the MIM capacitor stack comprise a substantially identical structure in alternating IMD layer; and
    wherein the respective upper end lower electrodes comprise a metal selected from the group consisting of Al, Cu, Ta, Ti, and nitrides that comprise silicided nitrides thereof.

2. The stacked MIM capacitor structure of claim 1, further comprising at least one additional MIM capacitor structure arranged in stacked relationship with respect to an underlying MIM capacitor structure wherein respective upper and lower electrodes of respective odd and even numbered MIM capacitor structures in the MIM capacitor stack comprise a commonly communicating electrical interconnect structure in parallel electrical relationship.

3. The stacked MIM capacitor structure of claim 1, wherein the upper electrodes including electrically communicating vias of the respective MIM structures in the MIM capacitor stack comprise a substantially identical structure.

4. The stacked MIM capacitor structure of claim 1, further comprising a capacitor dielectric sandwiched between the respective upper and lower electrodes, said capacitor dielectric selected from the group consisting of $SiO_2$, $Si_3N_4$, $TiO_2$, $Ta_2O_5$, $ZrO_2$, $Y_2O_3$, $La_2O_5$, and $HfO_2$.

5. The stacked MIM capacitor structure of claim 1, wherein the electrically communicating vias comprise a metal selected from the group consisting of Al, Cu, W, and alloys thereof.

6. The stacked MIM capacitor structure of claim 1, wherein the electrically communicating vias comprise a metal consisting essentially of W.

7. The stacked MIM capacitor structure of claim 1, wherein a lowermost MIM capacitor structure is formed in an IMD layer greater than about a second IMD layer formed over a semiconductor substrate.

8. The stacked MIM capacitor structure of claim 1, wherein the first upper electrode is arranged in common electrical signal communication with the second lower electrode according to at least one second electrically communicating via extending through said first IMD.

9. The stacked MIM capacitor structure of claim 1, wherein a respective lower electrode of a respective MIM capacitor structure has a width dimension greater than a respective upper electrode.

10. The stacked MIM capacitor structure of claim 1, wherein an upper and lower electrode of an uppermost MIM capacitor structure respectively electrically communicate with respective overlying bonding pads.

11. The, stacked MIM capacitor structure of claim 1, wherein said electrically communicating vias comprise vias extending through said first and second IMD layers.

12. A stacked integrated circuit (IC) MIM capacitor structure comprising:
 a first MIM capacitor structure disposed in a first IMD layer comprising a first upper electrode and a first lower electrode;
 at least a second MIM capacitor structure arranged in stacked relationship in an overlying IMD layer comprising a second upper electrode and second lower electrode separate from said first upper and first lower electrodes to form an MIM capacitor stack; and
 bonding pads formed in electric signal communication with the uppermost HIM capacitor structure;
 wherein, the first lower electrode is arranged in common electrical signal communication comprising electrically communicating vias with the second upper electrode and the first upper electrode is arranged in common electrical signal communication with the second lower electrode to form said MIM capacitor stack in parallel electrical relationship.

13. A stacked integrated circuit (IC) MIM capacitor structure comprising:
 a first MIM capacitor structure disposed in a first IMD layer comprising a first upper electrode and a first lower electrode; and,
 a second MIM capacitor structure arranged in stacked relationship in an overlying IMD layer comprising a second upper electrode and second lower electrode separate from said first upper and first lower electrode;
 wherein, the first lower electrode is arranged in common electrical signal communication comprising electrically communicating vias with the second upper electrode and the first upper electrode is arranged in common electrical signal communication with the second lower electrode; and,
 at least one additional MIM capacitor structure arranged in stacked relationship with respect to the second MIM capacitor structure to form an MIM capacitor stack wherein respective upper and lower electrodes of respective odd and even numbered MIM capacitor structures in the MIM capacitor stack comprise a commonly communicating electrical interconnect structure in parallel electrical relationship.

14. The stacked MIM capacitor structure of claim 13, further comprising a first and second uppermost conductive portion disposed overlying an uppermost IMD layer disposed to respectively provide electrical signal communication to said respective commonly communicating electrical interconnect structures.

15. The stacked MIM capacitor structure of claim 13, wherein the lower electrodes including electrically communicating vias of the respective MIM structures in the MIM capacitor stack comprise a substantially identical structure in alternating IMD layers.

16. A stacked integrated circuit (IC) MIM capacitor structure comprising:
 a first MIM capacitor structure disposed in a first IMD layer comprising a first upper electrode and a first lower electrode; and,
 a least a second MIM capacitor structure arranged in stacked relationship in an overlying IMD layer comprising a second upper electrode and second lower electrode separate from said first upper and first lower electrode to form an MIM capacitor stack;
 wherein, the first lower electrode is arranged in common electrical signal communication comprising electrically communicating vias with the second upper electrode and the first upper electrode is arranged in common electrical signal communication with the second lower electrode; and,
 wherein the lower electrodes including electrically communicating vias of the respective MIM structures in the MIM capacitor stack comprise a substantially identical structure in alternating IMD layers.

17. The stacked MIM capacitor structure of claim 16, wherein respective upper and lower electrodes in said alternating IMD layers comprise a commonly communicating electrical interconnect structure in parallel electrical relationship.

18. The stacked MIM capacitor structure of claim 17, further comprising a first and second uppermost conductive portion disposed overlying an uppermost IMD layer to respectively provide electrical signal communication to said respective commonly communicating electrical interconnect structures.

19. A stacked integrated circuit (IC) MIM capacitor structure comprising:
 a first MIM capacitor structure disposed in a first IMD layer comprising a first upper electrode and a first lower electrode; and,
 at least a second MIM capacitor structure arranged in stacked relationship in an overlying IMD layer comprising a second upper electrode and second lower electrode separate from said first upper and first lower electrodes to form an MIM capacitor stack;
 wherein, the first lower electrode is arranged in common electrical signal communication comprising electrically communicating vias with the second upper electrode and the first upper electrode is arranged in common electrical signal communication with the second lower electrode to form said MIM capacitor stack in parallel electrical relationship; and wherein an upper and lower electrode of an uppermost MIM capacitor structure respectively electrically communicate with respective overlying bonding pads.

* * * * *